US008335146B2

(12) United States Patent
Katsumura

(10) Patent No.: US 8,335,146 B2
(45) Date of Patent: Dec. 18, 2012

(54) MASTER DISK EXPOSING APPARATUS AND THE ADJUSTING METHOD THEREFOR

(75) Inventor: Masahiro Katsumura, Tsurugashima (JP)

(73) Assignee: NuFlare Technology, Inc., Numazu-shi (JP)

( * ) Notice: Subject to any disclaimer, the term of this patent is extended or adjusted under 35 U.S.C. 154(b) by 1042 days.

(21) Appl. No.: 12/294,164

(22) PCT Filed: Mar. 22, 2007

(86) PCT No.: PCT/JP2007/055847
§ 371 (c)(1),
(2), (4) Date: Dec. 10, 2008

(87) PCT Pub. No.: WO2007/119475
PCT Pub. Date: Oct. 25, 2007

(65) Prior Publication Data
US 2009/0204983 A1    Aug. 13, 2009

(30) Foreign Application Priority Data

Mar. 24, 2006    (JP) ................................ 2006-082925

(51) Int. Cl.
*G11B 17/03*    (2006.01)
(52) U.S. Cl. ........................................ 369/101; 720/700
(58) Field of Classification Search .................. 369/101, 369/126; 250/492.1, 492.3; 720/700
See application file for complete search history.

(56) References Cited

U.S. PATENT DOCUMENTS

| 6,203,968 | B1 * | 3/2001 | Igarashi ........................ 430/320 |
| 6,650,611 | B1 * | 11/2003 | Kamimura et al. ........... 369/101 |
| 2006/0076514 | A1 * | 4/2006 | Akeno ..................... 250/492.22 |
| 2006/0248967 | A1 * | 11/2006 | Tsukuda et al. ............. 73/865.9 |

FOREIGN PATENT DOCUMENTS

| JP | 04-013248 A | 1/1992 |
| JP | 06-004891 A | 1/1994 |
| JP | 06-131706 A | 5/1994 |
| JP | 11-296916 A | 10/1999 |
| JP | 2000-100002 A | 4/2000 |
| JP | 2004-164762 A | 6/2004 |
| JP | 2005-044474 A | 2/2005 |

* cited by examiner

*Primary Examiner* — Wayne Young
*Assistant Examiner* — Brenda Bernardi
(74) *Attorney, Agent, or Firm* — Oblon, Spivak, McClelland, Maier & Neustadt, L.L.P.

(57) ABSTRACT

A master disk exposing apparatus having: a turntable for rotating a master disk; moving means for horizontally moving the turntable in at least one direction; beam irradiating means for irradiating an electron beam toward the turntable, thereby forming a beam spot onto the turntable or the master disk; beam deflecting means for deflecting the beam; and control means for controlling the moving means, the beam irradiating means, and the beam deflecting means, wherein the control means includes initializing means for executing an initial operation to drive at least either the moving means or the beam deflecting means and make an origin of the beam spot coincide with a rotational center of the turntable at the time of activation. An apparatus and a method for easily adjusting a deviation between an origin of an irradiating position of the recording beam and the rotational center of the turntable are, thus, provided.

8 Claims, 17 Drawing Sheets

MASTER DISK EXPOSING APPARATUS AND THE ADJUSTING METHOD THEREFOR

1. Technical Field

The invention relates to a master disk exposing apparatus in which an irradiating position of a recording beam which is irradiated onto the master disk is adjusted and the adjusting method therefore.

2. Background Art

What are called hard disks as magnetic disk and optical disk are widely used as information recording media having a large recording capacity. In their manufacturing process, an electron beam master disk exposing apparatus having high recording resolution is used.

The master disk exposing apparatus generally has: an electron beam generating system for irradiating an electron beam to a master disk; and an x-θ stage system for rotating (θ) and horizontally moving (x) the master disk. By controlling the rotation (θ) and horizontal movement (x) of the master disk in a state where an irradiating position (i.e., beam spot) of the electron beam is fixed, recording information is concentrically or spirally written onto the master disk with respect to its rotational center (see, Patent Document 1: Japanese Patent Application Laid-open Kokai No. H06-131706).

For example, as shown in FIG. 1(A), in the case of recording four radial patterns in the radial direction from a rotational center O of a master disk D, the master disk D is rotated every 90° and an electron beam is irradiated onto the master disk D, thereby recording the first track as shown in FIG. 1(B). Subsequently, the master disk D is horizontally moved by a predetermined distance, the master disk D is rotated again every 90°, and the electron beam is irradiated onto the master disk D, thereby recording the second track as shown in FIG. 1(C). After that, in a manner similar to the above, by rotating and horizontally moving the master disk D and irradiating the electron beam, the radial patterns shown in FIG. 1(A) are formed.

In the master disk exposing apparatus having the construction, however, there is a case where when it is used for a long time, a deviation exceeding a permission amount occurs in an alignment among parts in the apparatus due to a vibration, a temperature change, or the like. Particularly, the writing of the recording state mentioned above is controlled on the assumption that an origin of a beam spot of a recording beam which is irradiated onto the master disk (that is, a position of the beam spot which is irradiated onto the master disk when no deflection is applied to the electron beam) coincides with the rotational center of the master disk. For example, therefore, if a deviation of a distance $\Delta x$ and $\Delta y$ has occurred between an origin $O_B$ of the beam spot of the recording beam and a rotational center $O_0$ of the master disk D as shown in FIG. 2(A), the recording position of the first track is as shown in FIG. 2(B). Although it is intended to form the patterns as shown in FIG. 1(A), patterns as shown in FIG. 2(C) are finally formed.

DISCLOSURE OF THE INVENTION

As a problem to be solved by the present invention, the above problem is mentioned as an example. It is an object of the invention to provide an apparatus and a method for easily adjusting a deviation between an origin of a beam spot of a recording beam and a rotational center of a master disk.

To accomplish the above object, according to the invention, there is provided a master disk exposing apparatus comprising: a turntable for rotating a master disk; moving means for horizontally moving the turntable in at least one direction; beam irradiating means for irradiating an electron beam toward the turntable, thereby forming a beam spot onto the turntable or the master disk; beam deflecting means for deflecting the beam; and control means for controlling the moving means, the beam irradiating means, and the beam deflecting means, characterized in that the control means includes initializing means for executing an initial operation to drive at least either the moving means or the beam deflecting means and make an origin of the beam spot coincide with a rotational center of the turntable at the time of activation.

According to the invention, there is provided an adjusting method of a beam irradiating position of a master disk exposing apparatus comprising: a turntable for rotating a master disk; moving means for horizontally moving the turntable in at least one direction; beam irradiating means for irradiating an electron beam toward the turntable, thereby forming a beam spot onto the turntable or the master disk; beam deflecting means for deflecting the beam; and control means for controlling the moving means, the beam irradiating means, and the beam deflecting means, characterized in that an initial operation to drive at least either the moving means or the beam deflecting means and make an origin of the beam spot coincide with a rotational center of the turntable is executed at the time of activation.

BRIEF DESCRIPTION OF DRAWINGS

FIG. 3 1 illustrates a block diagram of a master disk exposing apparatus according to an embodiment of the invention.

DESCRIPTION OF REFERENCE NUMERALS

Figure 1:
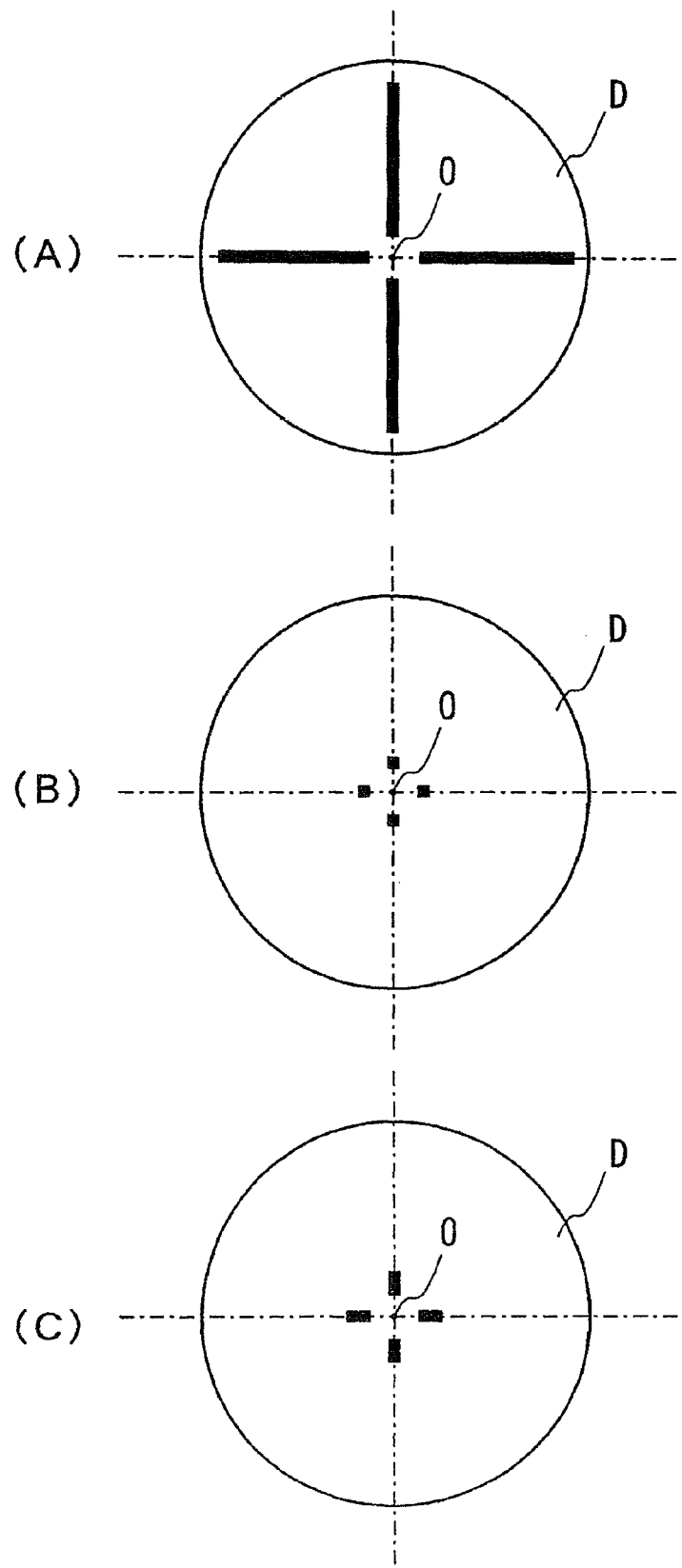
FIG. 1 illustrates a plan view of a master disk on which patterns are formed when an electron beam is irradiated onto the master disk in the case where an origin of a beam spot coincides with a rotational center of a turntable are shown.
Figure 2:
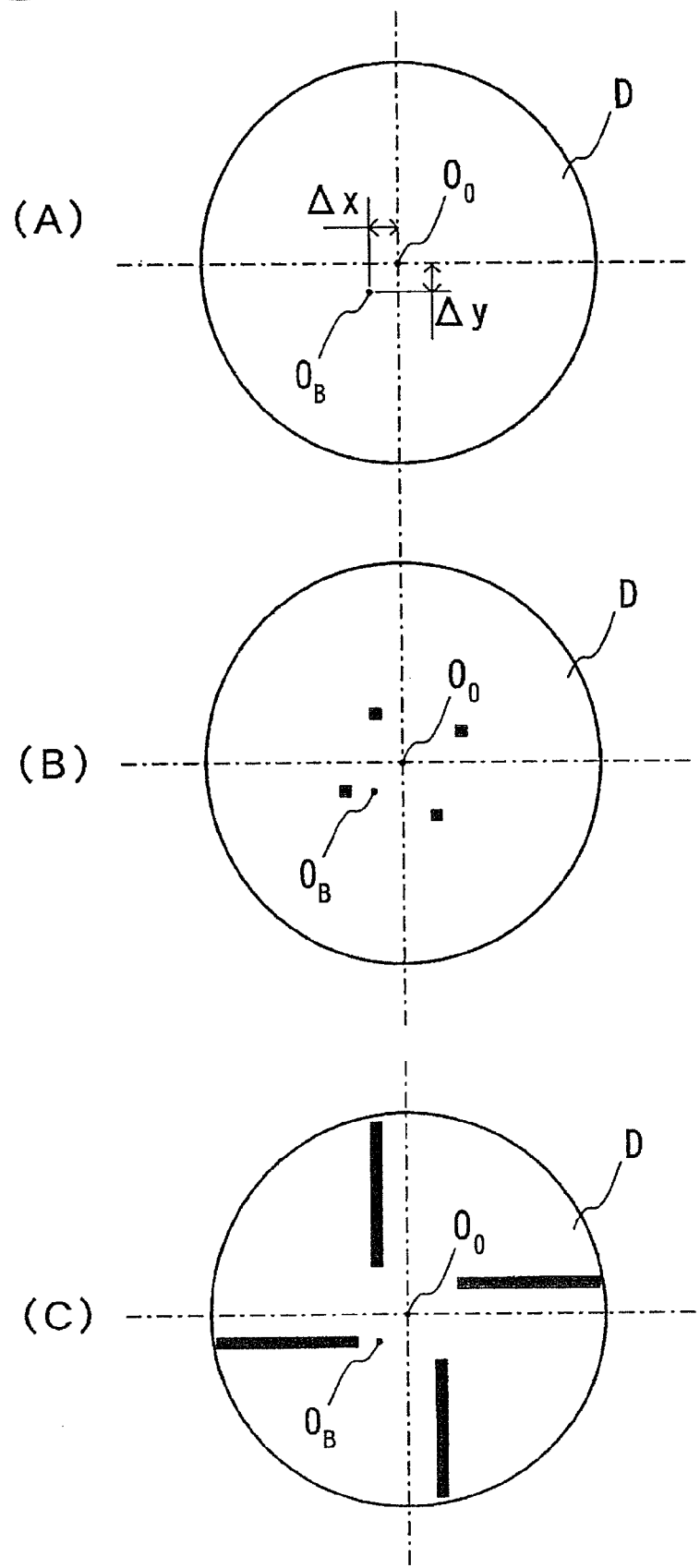
FIG. 2 illustrates a plan view of the master disk on which patterns which are formed when the electron beam is irradiated onto the master disk in the case where the origin of the beam spot is deviated from the rotational center of the turntable are shown.

100 . . . master disk exposing apparatus
200 . . . Electron beam generating system
201 . . . Electron beam column
202 . . . Electron beam source
203 . . . Condenser lens
204 . . . Beam modulator
205 . . . Aperture
206 . . . Beam deflector
207 . . . Objective lens
300 . . . Vacuum chamber system
301 . . . Vacuum chamber
302 . . . Turntable
303 . . . Spindle motor
304 . . . Moving stage
305 . . . Feed motor
306 . . . Screw mechanism
307 . . . Reflecting mirror
308 . . . Laser distance measuring system
309 . . . Fixed stage
310 . . . Mark detector
410 . . . Spindle motor control circuit
420 . . . Feed motor control circuit
430 . . . Irradiating position adjusting circuit
440 . . . Recording signal generating circuit
450 . . . Detection signal processing circuit
501 . . . CPU
502 . . . RAM
503 . . . ROM
720 . . . Hard disk
800 . . . Thermal nano-imprinting apparatus
D . . . master disk
M . . . Mark

BEST MODE FOR CARRYING OUT THE INVENTION

A master disk exposing apparatus according to an embodiment of the invention will be described hereinbelow.

Figure 3:
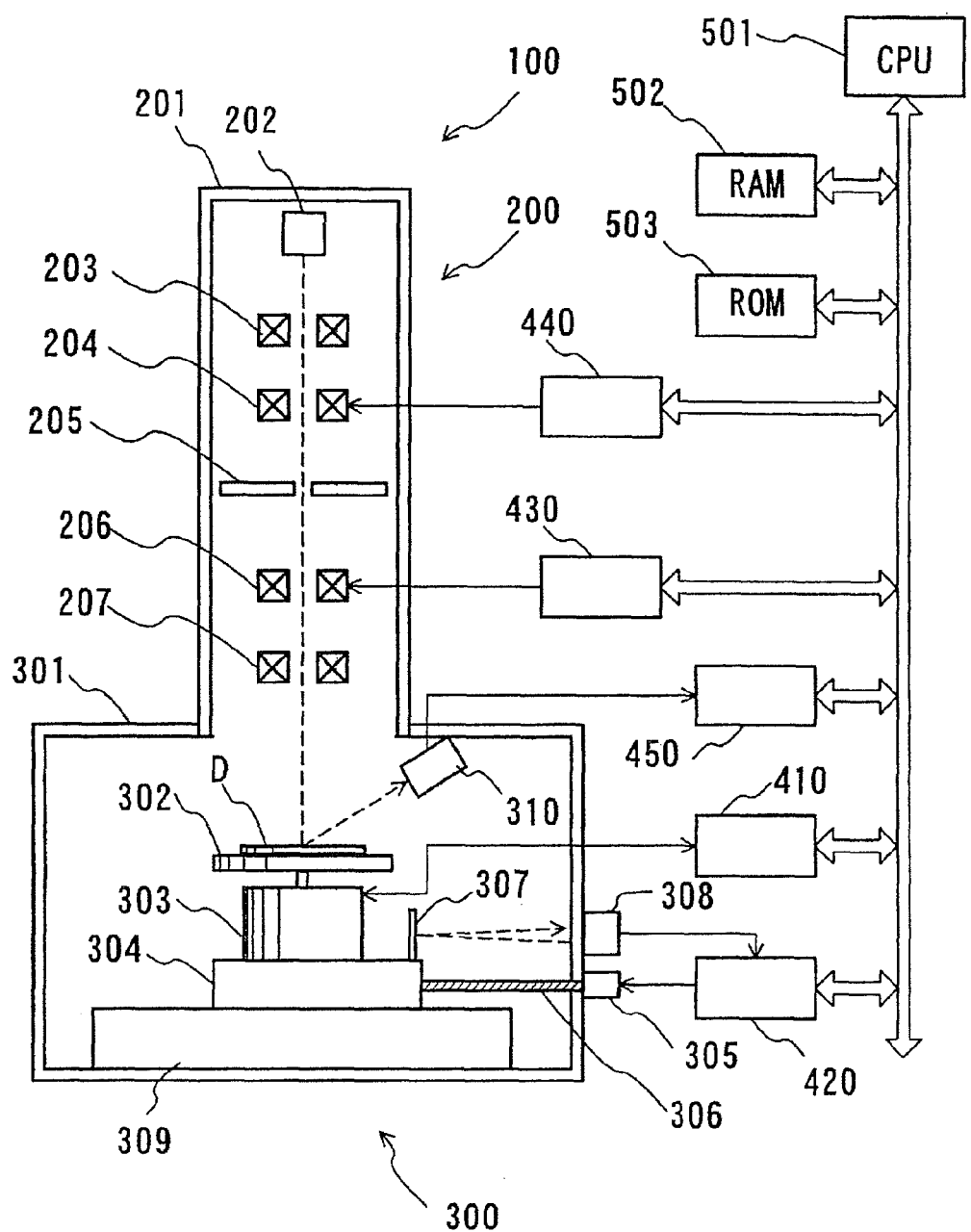

A master disk exposing apparatus 100 according to an embodiment of the invention is shown in FIG. 3.

The master disk exposing apparatus 100 is constructed by an electron beam generating system 200 and a vacuum chamber system 300. In the electron beam generating system 200, an electron beam generated from an electron beam source 202 is converged by a condenser lens 203 and sent to a beam modulator 204. In the beam modulator 204, whether or not the electron beam progresses downstream from an aperture 205 is controlled according to a recording signal which is transmitted from a recording signal generating circuit 440. The electron beam which has passed through the aperture 205 is sent to a beam deflector 206 constructed by an x-deflecting coil (not shown) and a y-deflecting coil (not shown). The irradiating position is corrected here on the basis of an adjustment signal which is sent from an irradiating position adjusting circuit 430. Further, a scan signal for a 2-dimensional scan in the x-y directions, which will be described hereinafter, is also sent from the irradiating position adjusting circuit 430 to the beam deflector 206. The electron beam emitted from the beam deflector 206 is converged in an objective lens 207 and a beam spot is formed onto the master disk D. The component elements of the electron beam generating system 200 are enclosed in an electron beam column 201 and mounted on a vacuum chamber 301. The electron beam source 202, the condenser lens 203, the beam modulator 204, the aperture 205, the objective lens 207, and the recording signal generating circuit 440 correspond to the beam irradiating means of the invention. The beam deflector 206 and the irradiating position adjusting circuit 430 correspond to the beam deflecting means of the invention.

In the vacuum chamber system 300, the master disk D is held by a chucking apparatus (not shown) or the like on a turntable 302 so that a rotational center of the master disk D coincides with a rotational center of the turntable 302. The turntable 302 is rotated by a spindle motor 303. The spindle motor 303 is provided with a rotary encoder (not shown) to control its rotation with high precision. A rotational angle signal generated from the rotary encoder is processed by a spindle motor control circuit 410. The spindle motor 303 is provided on a moving stage 304. The moving stage 304 is slidably mounted on a fixed stage 309 and is further coupled with a feed motor 305 through a screw mechanism 306. The moving stage 304 is, consequently, reciprocated in the horizontal direction (x direction) by a rotation of the feed motor 305. The moving stage 304, feed motor 305, and screw mechanism 306 correspond to moving means in the invention. A reflecting mirror 307 is fixed to an edge portion of the moving stage 304. A laser distance measuring system 308 is further arranged at a position to face the reflecting mirror 307. A laser beam for measuring a distance generated from the laser distance measuring system 308 is reflected by the reflecting mirror 307 and detected by a detecting unit (not shown) of the laser distance measuring system 308. A distance between the reflecting mirror 307 and the detecting unit of the laser distance measuring system 308 is, thus, measured. A feed motor control circuit 420 controls the rotation of the feed motor 305 on the basis of a detection signal sent from the laser distance measuring system 308. The moving stage 304 may be moved in two directions of the x direction and the y direction. In the above case, a mechanism for horizontally moving the moving stage 304 in the y direction and its control system are additionally necessary. A mark detector 310 to detect a secondary electron that is generated at the time of the 2-dimensional scan of the electron beam, which will be explained hereinafter, or a reflection electron is further provided for the exposing apparatus according to the embodiment of the invention. A detection signal detected by the mark detector 310 is processed by a detection signal processing circuit 450. The mark detector 310 and the detection signal processing circuit 450 correspond to mark position detecting means in the invention. Component elements (excluding a part thereof) of the vacuum chamber system 300 are arranged in the vacuum chamber 301. The inside of the vacuum chamber 301 is held in a vacuum state. The foregoing various kinds of circuits are connected to a CPU 501 together with a RAM 502, a ROM 503, and the like through a bus and various kinds of control are made. The CPU 501, the RAM 502, and the ROM 503 correspond to control means of the invention.

Figure 5:
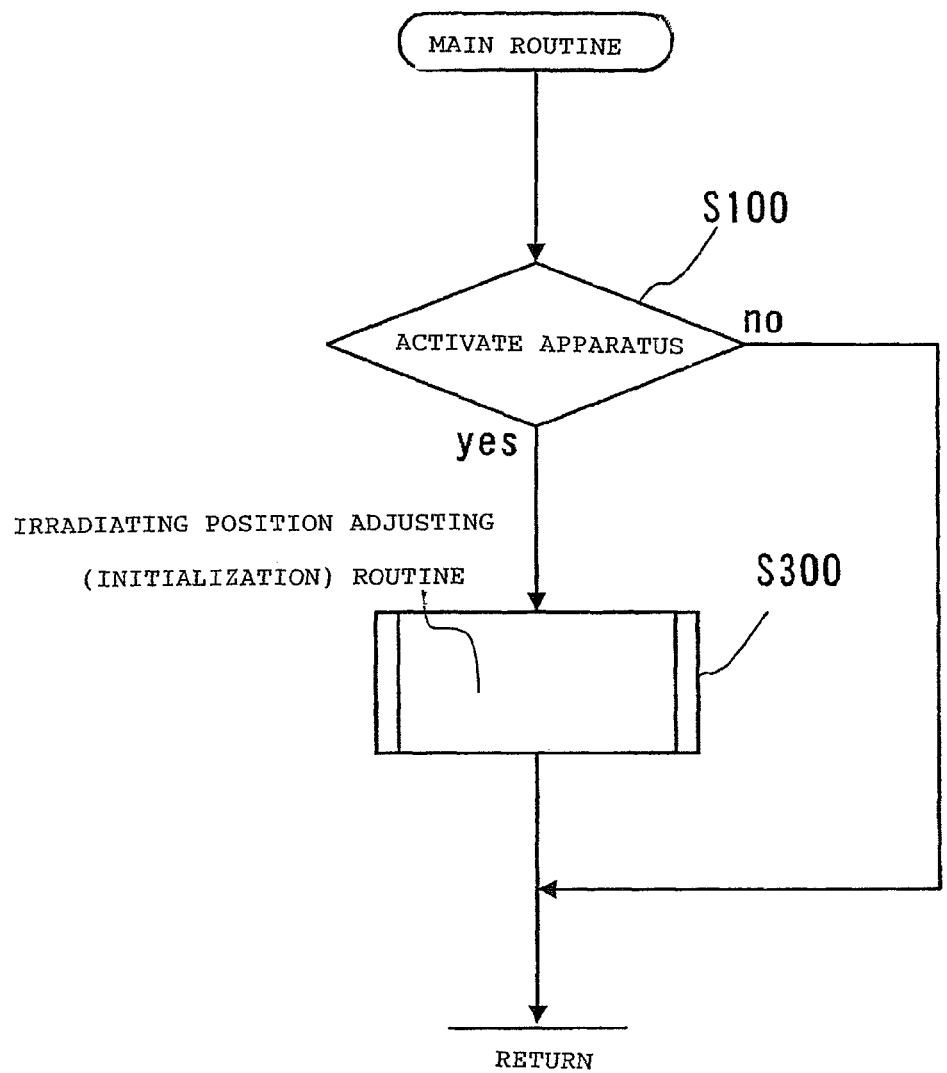
FIG. 5 illustrates a flowchart for an irradiating position adjusting routine according to the first embodiment of the invention.

Subsequently, an adjusting method of a deviation between the origin of the beam spot of the electron beam and the rotational center of the master disk, that is, the rotational center of the turntable in the first embodiment of the invention will be described with reference to a flowchart shown in FIG. 5.

Figure 4:
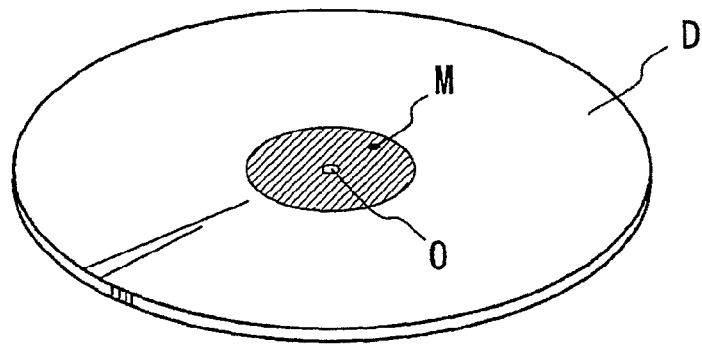
FIG. 4 illustrates a perspective view of a master disk having a mark.

In order to make the irradiating position adjustment in the first embodiment of the invention, it is necessary that the mark for calculating the rotational center has preliminarily been formed at a position on the master disk D or on the turntable excluding its rotational center. FIG. 4 shows a state where a mark M has been formed in a center area (shown by a hatched portion in FIG. 4) on the master disk D where the recording information is not written, that is, in a position other than a rotational center O. In the case of forming the mark onto the turntable, it is preferable to form the mark into an area where it coincides with the center area of the master disk when seen directly overhead in the case where the master disk is disposed onto the turntable, that is, into an area on the turntable other than the rotational center. A shape, a size, a color, a material, and the like of the mark may be arbitrarily set so long as the mark can be detected at desired precision in the scan of the electron beam, which will be described hereinafter.

When the master disk D is put onto the turntable and the master disk exposing apparatus is activated, an initial operation, that is, an irradiating position adjusting routine is started (step S100). In step S100, for example, it is also possible to construct in such a manner that a value of an accumulated operation time of the master disk exposing apparatus, an elapsed time from the delivery of the apparatus, a measurement value such as a temperature which can exert an influence on an apparatus alignment, or the like is confirmed, only when the confirmed value exceeds a predetermined threshold value, an operating mode advances to the irradiating position adjusting routine, and when the value does not exceed the threshold value, the irradiating position adjusting routine is skipped.

Figure 6:
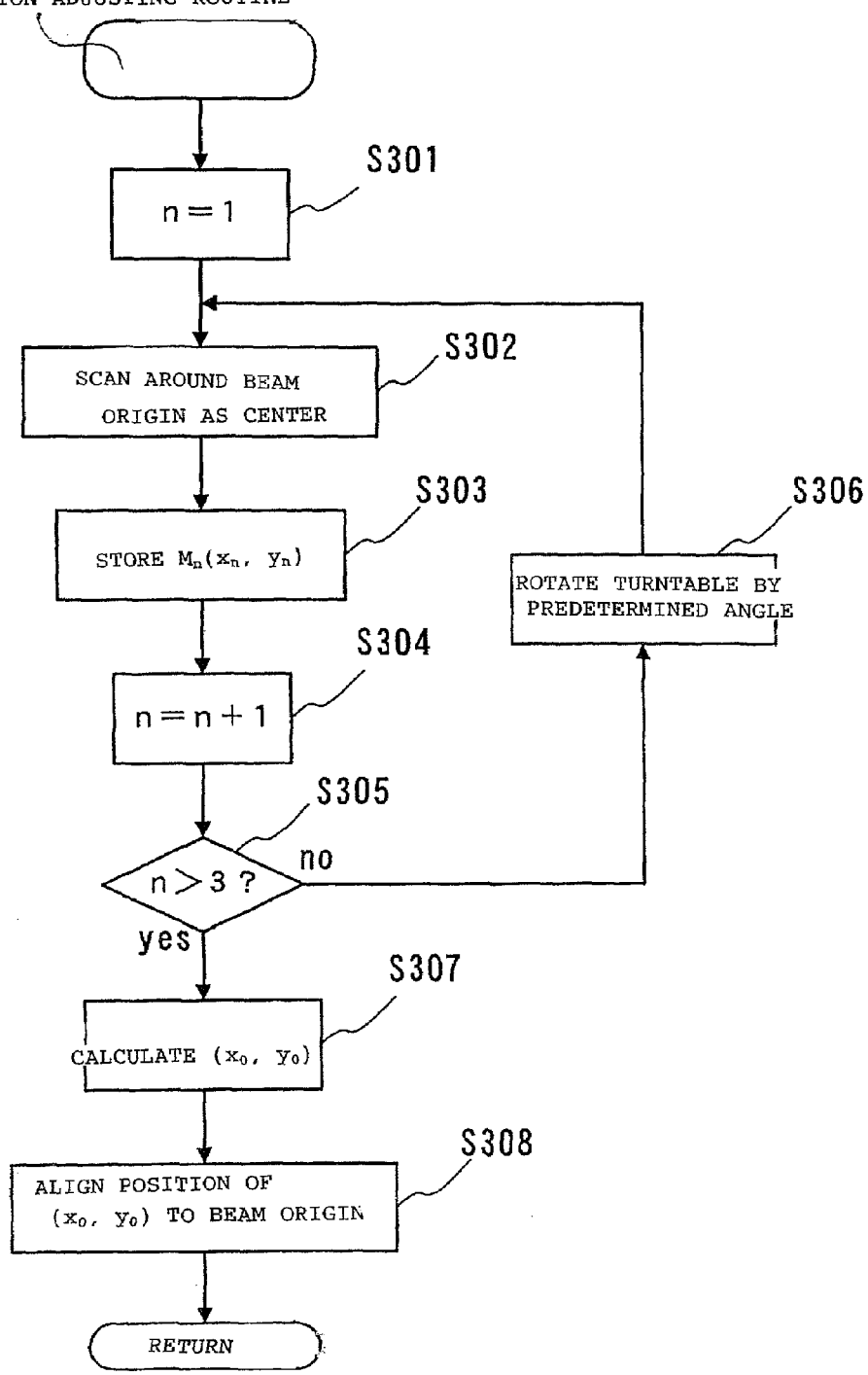
FIG. 6 illustrates a detailed flowchart for the irradiating position adjusting routine according to the first embodiment of the invention.
Figure 7:
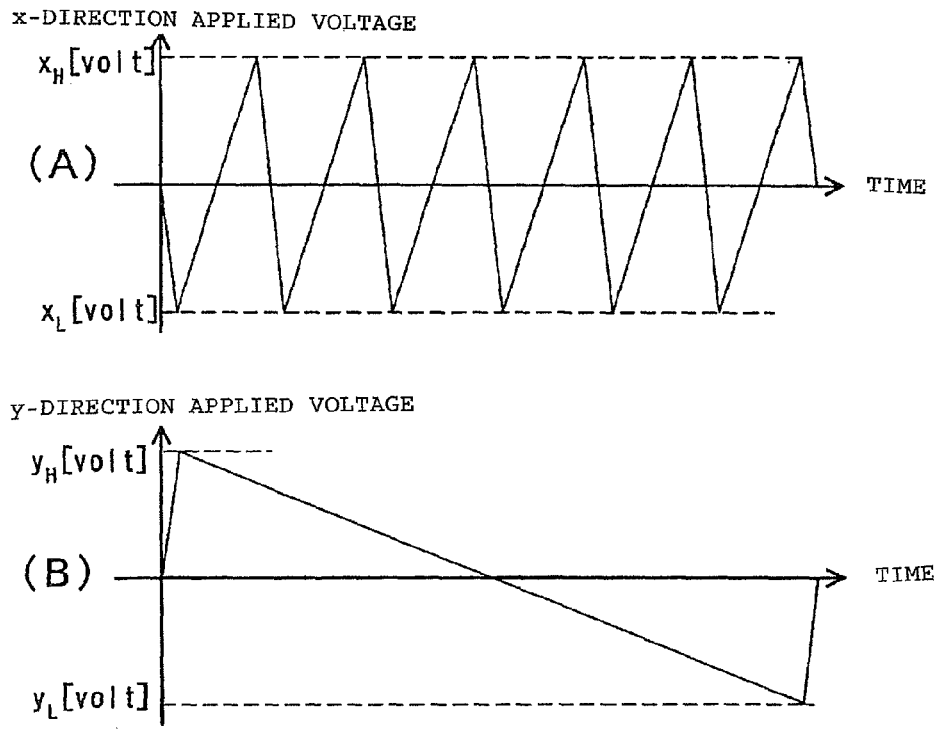
FIG. 7 illustrates graphs showing time changes in applied voltages in an x direction and a y direction which are applied to a beam deflector upon scanning.
Figure 8:
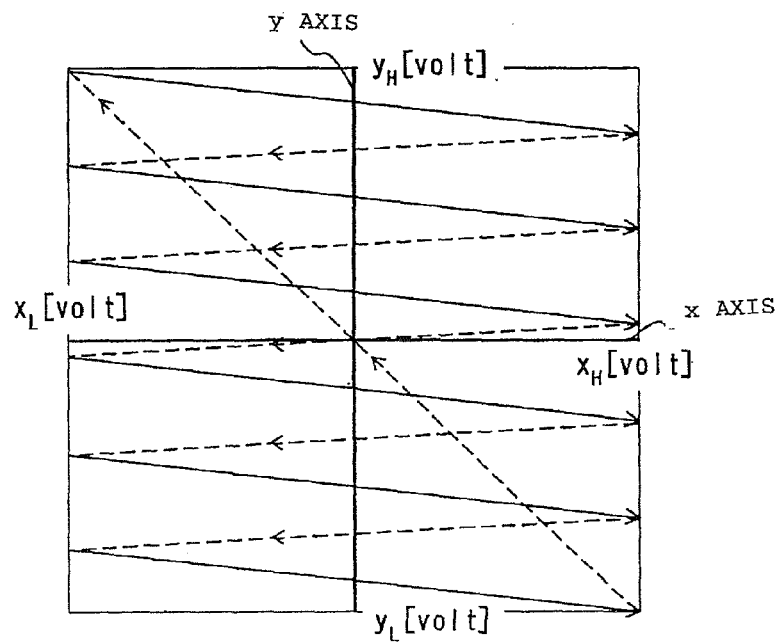
FIG. 8 illustrates a diagram in the case where a locus of a scanning beam which is obtained by the applied voltages in FIG. 7 is shown on a scanning coordinate system.

A detailed flowchart of the irradiating position adjusting routine (step S300) is shown in FIG. 6. First, in S301, "1" is set as an initial value into a value of n indicative of the number of scanning times. Next, in S302, the electron beam is generated from the electron beam source 202 and, at the same time, a scan signal is sent to the beam deflector 206 from the irradiating position adjusting circuit 430, so that the center area of the master disk is two-dimensionally scanned in the x-y directions around the beam origin as a center. A state of the scan signal which is sent to the beam deflector 206 is shown in FIGS. 7(A) and 7(B). Specifically speaking, FIG. 7(A) shows a change in voltage which is applied to the x-deflecting coil of the beam deflector 206 in the 2-dimensional scan, an axis of ordinate indicates the applied voltage, and an axis of abscissa indicates the time. FIG. 7(B) shows a change in voltage which is applied to the y-deflecting coil of the beam deflector 206 in the 2-dimensional scan, an axis of ordinate indicates the applied voltage, and an axis of abscissa indicates the time. A deflection in the x direction is applied to the electron beam by the x-deflecting coil and a deflection in the y direction is applied to the electron beam by the y-deflecting coil. A locus of the scanning beam at the time when the 2-dimensional scan has been performed by the applied voltages in FIGS. 7(A) and 7(B) is shown in FIG. 8. A value of the x axis corresponds to the value of the voltage which is applied to the x-deflecting coil of the beam deflector 206 and a value of the y axis corresponds to the value of the voltage which is applied to the y-deflecting coil of the beam deflector 206. That is, as for an area shown by an x-y coordinate system shown in FIG. 8, the area which is two-dimensionally scanned by the electron beam is shown by: the voltage which is applied to the x-deflecting coil of the beam deflector 206 (a minimum applied voltage is assumed to be $x_L$ volts and a maximum applied voltage is assumed to be $x_H$ volts); and the voltage which is applied to the y-deflecting coil (a minimum applied voltage is assumed to be $y_L$ volts and a maximum applied voltage is assumed to be $y_H$ volts). In the following description, the above area is referred to as an applied voltage reference scanning area and the coordinate system which is used in the above area is referred to as an applied voltage reference scanning coordinate system. The origin $O_B(x_B, y_B)$ corresponds to an origin of the irradiating position of the electron beam which is not deflected to both of the x direction and the y direction in the beam deflector 206. FIGS. 7(A), 7(B), and 8 illustrate a state where the number of scanning lines has been reduced for simplicity of explanation. The secondary electron and reflection electron that is generated by the beam irradiation at the time of the scanning is detected by the mark detector 310 synchronously with the scan. A detection signal detected by the mark detector 310 is subjected to processes such as amplification and A/D conversion in the detection signal processing circuit 450 and sent to the CPU.

Figure 9A:
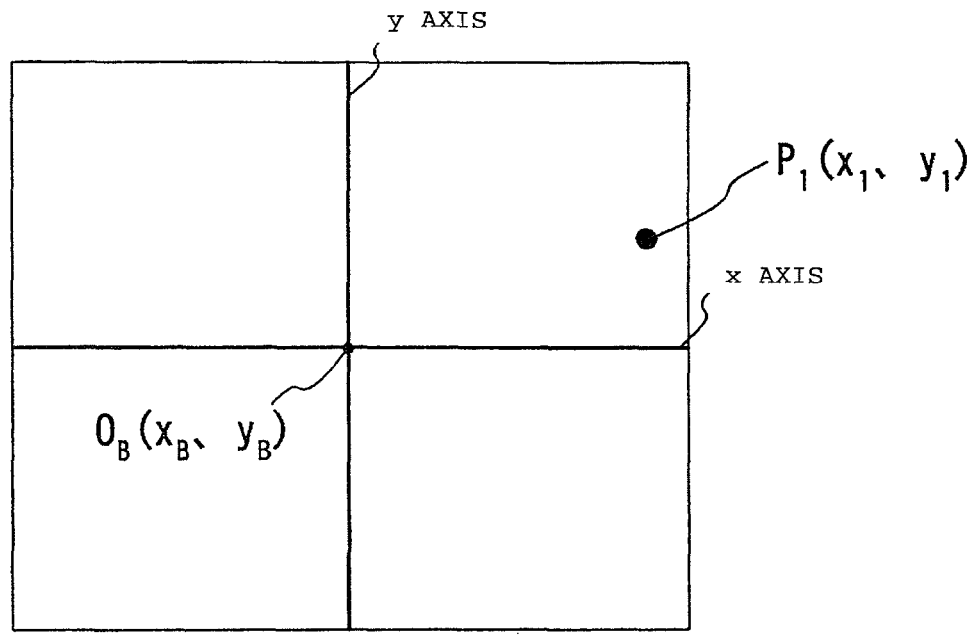
FIG. 9 illustrates a diagram in the case where a position of the mark is shown on the scanning coordinate system according to the first embodiment of the invention.

In FIG. 9(A), a detection result by the 2-dimensional scan is shown in the applied voltage reference scanning area and a position of the mark M is shown here as a point $P_1(x_1, y_1)$. That is, the diagram shows a state where the mark M exists at the position of the beam spot which is formed on the master disk D or the turntable by the electron beam deflected by applying a voltage of $x_1$ to the x-deflecting coil of the beam deflector 206 and applying a voltage of $y_1$ to the y-deflecting coil. Values $(x_1, y_1)$ of the coordinates are stored in a memory in step S303.

Subsequently, in S304, the value of n is incremented to n=2. Since the value does not satisfy a discriminating expression in step S305, the processing routine advances to step S306 in order to execute the scan of the second time.

In step S306, a signal is transmitted to the spindle motor 303 from the spindle motor control circuit 410, so that the turntable 302 is rotated only by a predetermined rotational angle which is larger than 0° and smaller than 180°. After that, step S302 is executed again and the scan of the second time is executed. That is, in a manner similar to the scan of the first time, the electron beam is generated from the electron beam source 202, the scan signal is sent from the irradiating position adjusting circuit 430 to the beam deflector 206, and the center area of the master disk is two-dimensionally scanned in the x-y directions around the beam origin as a center. The secondary electron or reflection electron which is generated synchronously with the scan is detected by the mark detector 310. The detection signal detected by the mark detector 310 is transmitted to the CPU 501 through the detection signal processing circuit 450.

Figure 9B:
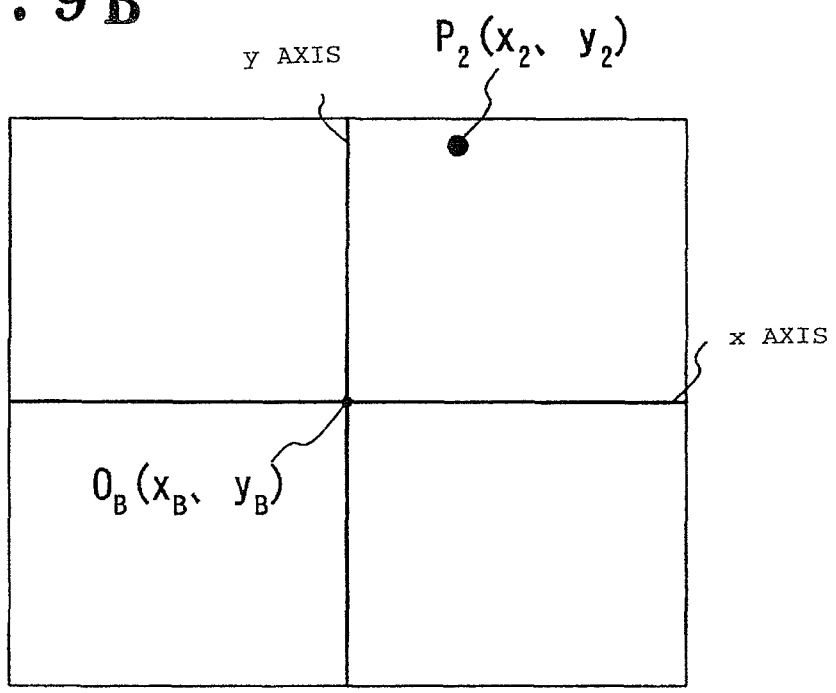

In FIG. 9(B), a result of the scan of the second time is shown in the applied voltage reference scanning area. Also in the scan of the second time, since the same scan signal as that at the first time is sent to the beam deflector 206, the applied voltage reference scanning coordinate system shown in FIG. 9(B) and the applied voltage reference scanning coordinate system shown in FIG. 9(A) are substantially the same. A point $P_2$ shown in FIG. 9(B) is a position on the scanning coordinate system of the mark M after the mark was rotated from the point $P_1$ at the time of the scan of the first time only by the predetermined rotational angle. Values $(x_2, y_2)$ of the coordinates are stored in the memory.

Subsequently, in S304, the value of n is incremented to n=3. Since the value does not satisfy the discriminating expression in step S305, the processing routine advances to step S306 in order to execute the scan of the third time. In step S306, the signal is transmitted to the spindle motor 303 from the spindle motor control circuit 410, so that the turntable 302 is rotated again only by the predetermined rotational angle. After that, in step S302, the scan of the third time and an inspection are executed in a manner similar to the scans of the first and second times and a detection signal is transmitted to the detection signal processing circuit 450.

Figure 9C:
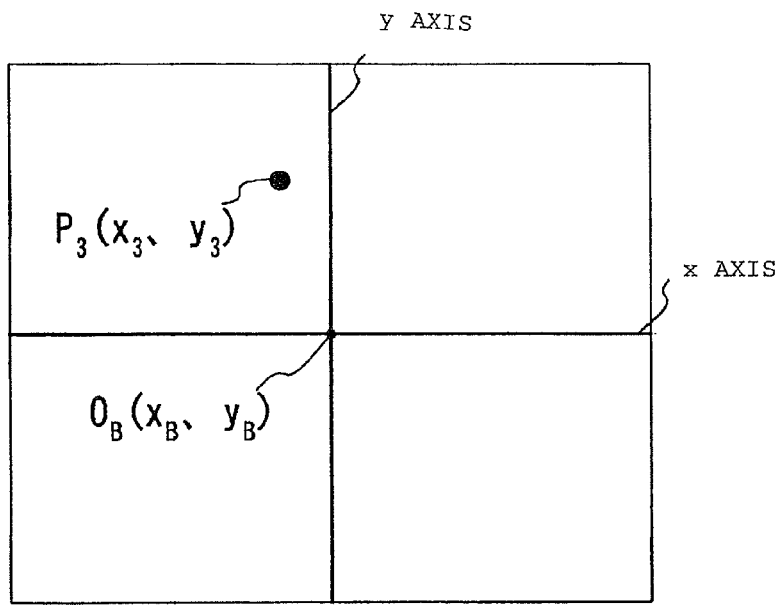

In FIG. 9(C), a result of the scan of the third time is shown in the applied voltage reference scanning area. Also in the scan of the third time, since the same scan signal as that at each of the first time and the second time is sent to the beam deflector 206, the applied voltage reference scanning coordinate system shown in FIG. 9(C) and the applied voltage reference scanning coordinate system shown in each of FIGS. 9(A) and 9(B) are substantially the same. A point $P_3$ shown in FIG. 9(C) is a position on the applied voltage reference scanning coordinate system of the mark M after the mark was rotated from the point $P_2$ at the time of the scan of the second time only by the predetermined rotational angle. Values ($x_3$, $y_3$) of the coordinates are stored in the memory.

Subsequently, in S304, the value of n is incremented to n=4. Since the value satisfies the discriminating expression in step S305, the processing routine advances to step S307.

Figure 9D:
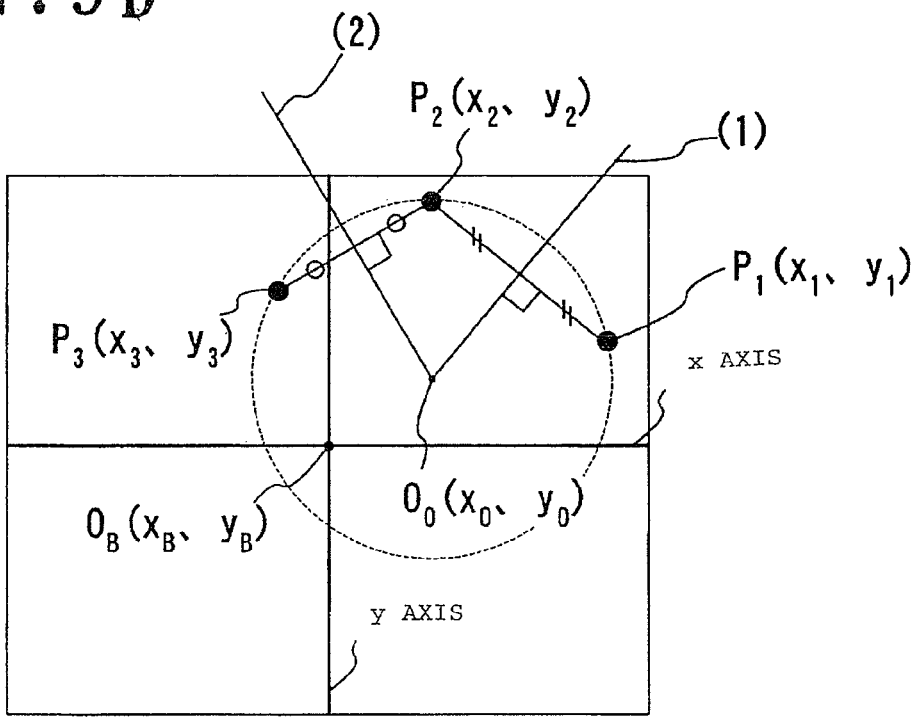

In step S307, a position on the scanning coordinate system of the rotational center of the turntable is obtained on the basis of the coordinate values ($x_1$, $y_1$), ($x_2$, $y_2$), and ($x_3$, $y_3$) read out of the memory. In FIG. 9(D), the coordinates $P_1(x_1, y_1)$, $P_2(x_2, y_2)$, and $P_3(x_3, y_3)$ are shown in the applied voltage reference scanning area. Since each of the coordinates $P_1(x_1, y_1)$, $P_2(x_2, y_2)$, and $P_3(x_3, y_3)$ indicate the position on the applied voltage reference scanning coordinate system of the mark M at the time when the mark M has been moved in association with the rotation of the turntable, a center of a circumscribed circle (shown by a broken line in FIG. 9(D)) of a triangle in which the coordinates $P_1(x_1, y_1)$, $P_2(x_2, y_2)$, and $P_3(x_3, y_3)$ are set to vertices indicates the position of the rotational center of the turntable in the applied voltage reference scanning coordinate system. In the first embodiment, an intersection point of a perpendicular bisector of a line segment connecting the points $P_1$ and $P_2$ and a perpendicular bisector of a line segment connecting the points $P_2$ and $P_3$ is obtained, and coordinates ($x_0$, $y_0$) on the applied voltage reference scanning coordinate system of the rotational center $O_0$ of the turntable are obtained.

As will be understood from FIG. 9(D), an equation of a perpendicular bisector (1) of the line segment connecting the points $P_1$ and $P_2$ is $$y = -\{(x_2-x_1)/(y_2-y_1)\}\cdot x + (y_1+y_2)/2 + \{(x_2-x_1)/(y_2-y_1)\}\cdot\{(x_1+x_2)/2\} \quad \text{<Expression 1>}$$

An equation of a perpendicular bisector (2) of the line segment connecting the points $P_2$ and $P_3$ is $$y = -\{(x_3-x_2)/(y_3-y_2)\}\cdot x + (y_2+y_3)/2 + \{(x_3-x_2)/(y_3-y_2)\}\cdot\{(x_2+x_3)/2\} \quad \text{<Expression 2>}$$

By solving those simultaneous equations, therefore, the values of the rotational center coordinates ($x_0$, $y_0$) of the turntable are obtained as follows (step S307).

$$x_0 = (y_3-y_1)/2 + (x_3-x_2)/(y_3-y_2) - \{(x_2-x_1)/(y_2-y_1)\}\cdot\{(x_1+x_2)/2\} \quad \text{<Expression 3>}$$

$$y_0 = -\{(x_2-x_1)/(y_2-y_1)\}\cdot[(y_3-y_1)/2 + (x_3-x_2)/(y_3-y_2) - \{(x_2-x_1)/(y_2-y_1)\}\cdot\{(x_1+x_2)/2\}] + \{(x_2-x_1)/(y_2-y_1)\}\cdot\{(x_1+x_2)/2\} \quad \text{<Expression 4>}$$

That is, the portions adapted to execute steps S301 to S307 correspond to rotational center deviation amount detecting means of the invention. Naturally, as a calculating method of obtaining the coordinates of the center of a circle which passes through the three points $P_1$, $P_2$, and $P_3$ from the coordinates of $P_1$, $P_2$, and $P_3$, there is an arbitrary method other than the above method.

As mentioned above, since the x axis in the applied voltage reference scanning coordinate system corresponds to the scan signal in the x direction transmitted from the irradiating position adjusting circuit 430 to the beam deflector 206, by sending an applied signal expressed by $x_0$ in Expression 3 as a correction value to the beam deflector in an exposing step, a deviation amount in the x direction between the origin of the irradiating position and the rotational center of the turntable, that is, a deviation can be adjusted. Similarly, by sending an applied signal expressed by $y_0$ in Expression 4 as a correction value to the beam deflector in the exposing step, a deviation in the y direction between the origin of the irradiating position and the rotational center of the turntable can be adjusted (step S308). That is, the portion adapted to execute step S308, the irradiating position adjusting circuit 430, and the beam deflector 206 correspond to first beam position adjusting means of the invention.

Although both of the deviation in the x direction and the deviation in the y direction have been adjusted by the beam deflector in the above embodiment, the invention is not limited to the above case. For example, if a correlation between the value of the x axis in the applied voltage reference scanning coordinate system and a movement distance in the x direction of the moving stage 304 have previously been known, the deviation in the x direction between the origin of the irradiating position and the rotational center of the turntable may be adjusted as a movement of the moving stage 304 by the signal which is transmitted from the feed motor control circuit 420 to the feed motor 305 instead of the beam deflector. That is, the portion adapted to execute step S308, the feed motor control circuit 420, the feed motor 305, and the moving stage 304 correspond to second beam position adjusting means in the invention. Further, if the moving stage 304 moves in two directions of the x and y directions and a correlation between the value of the y axis in the applied voltage reference scanning coordinate system and a movement distance in the y direction of the moving stage 304 have previously been known, the deviation in the y direction between the origin of the irradiating position and the rotational center of the turntable may be adjusted as a movement in the y direction of the moving stage instead of the beam deflector in a manner similar to the adjustment in the x direction mentioned above. Further, it is also possible to construct in such a manner that the adjustment in the moving stage 304 and the adjustment in the beam deflector are combined and, for example, a coarse adjustment is made by the movement of the moving stage 304, and a fine adjustment is made by the deflection of the beam deflector.

As mentioned above, according to the first embodiment of the invention, by scanning the area where the mark formed on the master disk or the turntable by the electron beam which is used at the time of the exposure of the exposing apparatus, the deviation between the origin of the irradiating position of the electron beam and the rotational center of the turntable can be automatically adjusted, so that the deviation can be easily adjusted without causing a troublesomeness of the operator. Since the deviation is adjusted by using the electron beam that is caused in the exposing apparatus itself, it can be precisely adjusted. Further, since a deviation adjusting means can be selected from either the beam deflector or the moving stage, it is possible to cope with various types of exposing apparatuses.

Subsequently, an adjusting method of the deviation between the origin of the irradiating position of the beam and the rotational center of the turntable in the second embodiment of the invention will be described.

Figure 10:
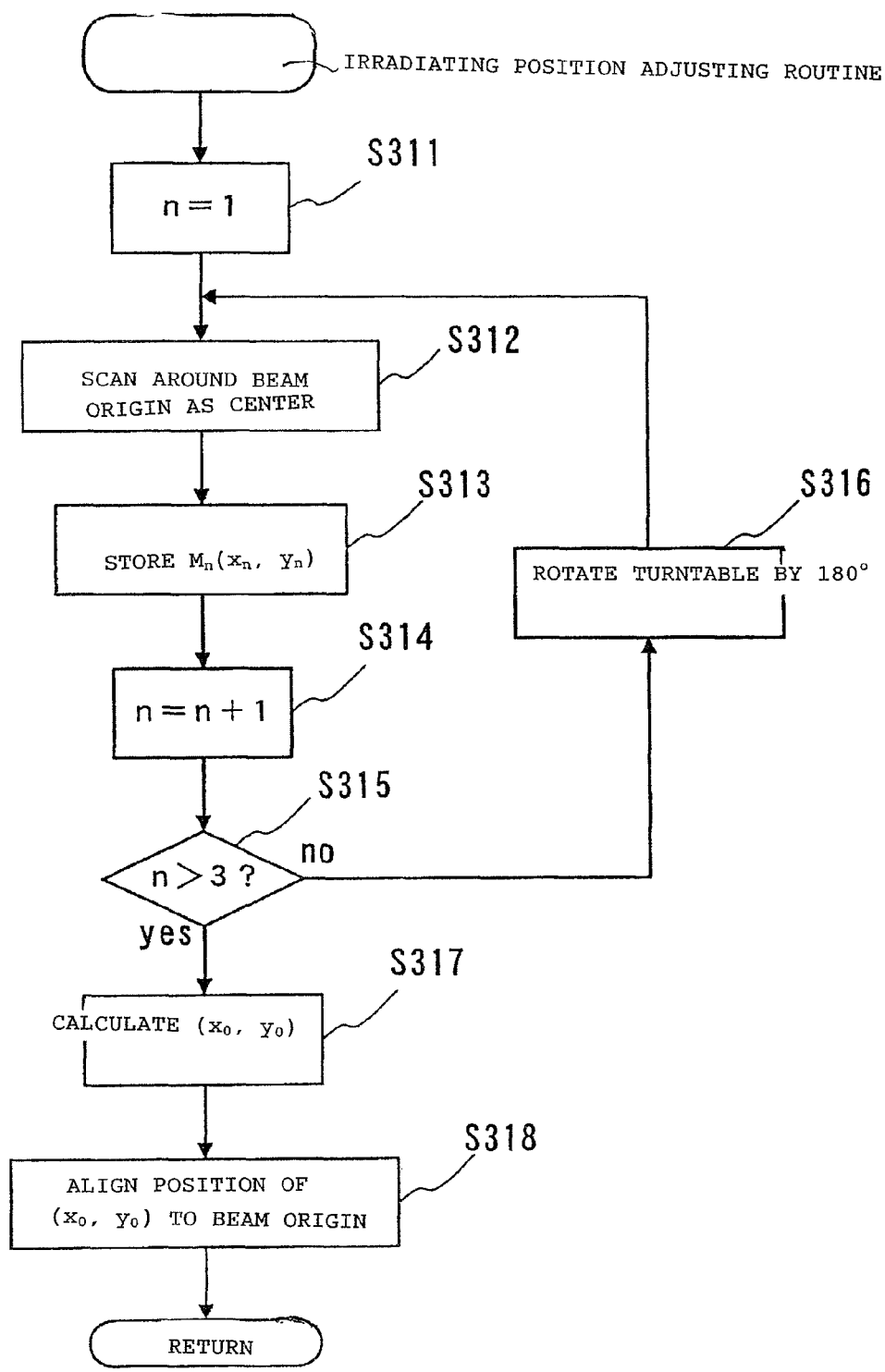
FIG. 10 illustrates a detailed flowchart for an irradiating position adjusting routine according to the second embodiment of the invention.

In the second embodiment, since an irradiating position adjusting routine differs from that in the first embodiment, the irradiating position adjusting routine will be described hereinbelow. A flowchart for the irradiating position adjusting routine according to the second embodiment of the invention is shown in FIG. 10.

Steps of performing the scan of the first time are similar to those in the first embodiment. That is, n=1 is set (step S311). The scan signal is transmitted from the irradiating position adjusting circuit 430 to the beam deflector 206, the center area of the master disk is two-dimensionally scanned in the x-y directions around the beam origin as a center, and the secondary electron or reflection electron which is consequently generated is detected by the mark detector 310 (step S312). The detection signal detected by the mark detector 310 is transmitted to the CPU 501 through the detection signal processing circuit 450. The coordinate values $(x_1, y_1)$ in the applied voltage reference scanning coordinate system of the point $P_1$ are stored (step S313). The value of n is incremented to n=2 (step S314). Since the value n=2 does not satisfy a discriminating expression, the processing routine advances to step S316 (step S315).

In step S316, the turntable 302 is rotated by the spindle motor control circuit 410. At this time, in the second embodiment, a rotational angle of the turntable is controlled so as to become 180° by the rotary encoder (not shown) provided for the spindle motor 303.

After that, the scan of the second time is executed again in a manner similar to the scan of the first time. That is, the scan signal is transmitted from the irradiating position adjusting circuit 430 to the beam deflector 206, the center area of the master disk is two-dimensionally scanned in the x-y directions around the beam origin as a center, and the generated secondary electron or reflection electron is detected by the mark detector 310 (step S312). The detection signal detected by the mark detector 310 is transmitted to the CPU 501 through the detection signal processing circuit 450. The coordinate values $(x_2, y_2)$ in the applied voltage reference scanning coordinate system of the point $P_2$ are stored (step S313). The value of n is incremented to n=3 (step S314) and the processing routine advances to step S315.

In the second embodiment, since a discriminating expression in step S315 differs from that in the first embodiment, if the scan of the second time is completed, the discriminating expression is satisfied, so that the processing routine advances to step S317. That is, the scan of the third time is not executed in the second embodiment.

Figure 11:
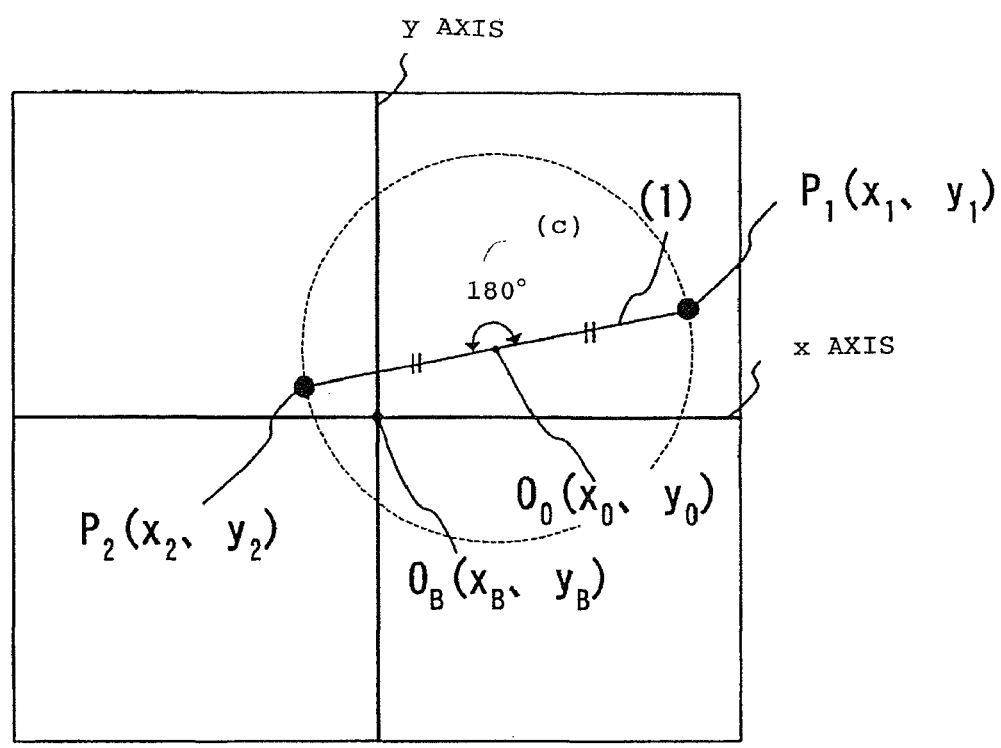
FIG. 11 illustrates a diagram in the case where the position of a mark is shown on a scanning coordinate system according to the second embodiment of the invention.

In step S317, the position on the applied voltage reference scanning coordinate system of the rotational center of the turntable is obtained on the basis of the coordinate values $(x_1, y_1)$ and $(x_2, y_2)$ read out of the memory. In FIG. 11, the coordinates $P_1(x_1, y_1)$ and $P_2(x_2, y_2)$ are shown in the applied voltage reference scanning area. Since each of the coordinates $P_1(x_1, y_1)$ and $P_2(x_2, y_2)$ indicate the position on the applied voltage reference scanning coordinate system of the mark M at the time when the mark M has been moved in association with the rotation of 180° of the master disk, the center of a line segment connecting the points $P_1$ and $P_2$ indicates the position of the rotational center of the turntable on the applied voltage reference scanning coordinate system.

As shown in FIG. 11, therefore, the center point of the line segment (1) connecting the points $P_1$ and $P_2$, that is, the coordinates $(x_0, y_0)$ of the rotational center $O_0$ of the turntable are obtained by $$x_0 = (x_1 + x_2)/2 \qquad \text{<Expression 5>}$$

$$x_0 = (y_1 + y_2)/2 \qquad \text{<Expression 6>}$$

(step S317). That is, the portions adapted to execute steps S311 to S317 correspond to the rotational center deviation amount detecting means in the invention.

After that, in a manner similar to the first embodiment, by sending the applied signal expressed by $x_0$ as a correction value to the beam deflector in the exposing step, the deviation in the x direction between the origin of the irradiating position and the rotational center of the turntable is adjusted, and by sending the applied signal expressed by $y_0$ as a correction value to the beam deflector in the exposing step, the deviation in the y direction between the origin of the irradiating position and the rotational center of the turntable is adjusted (step S318).

In a manner similar to the first embodiment, the deviation may be adjusted by the movement of the moving stage instead of the beam deflector. Further, the deviation may be adjusted by a combination of the deflection of the beam deflector and the movement of the moving stage.

As mentioned above, according to the second embodiment of the invention, since the deviation can be adjusted only by executing the scan twice, the irradiating position can be adjusted in a short time.

Figure 12:
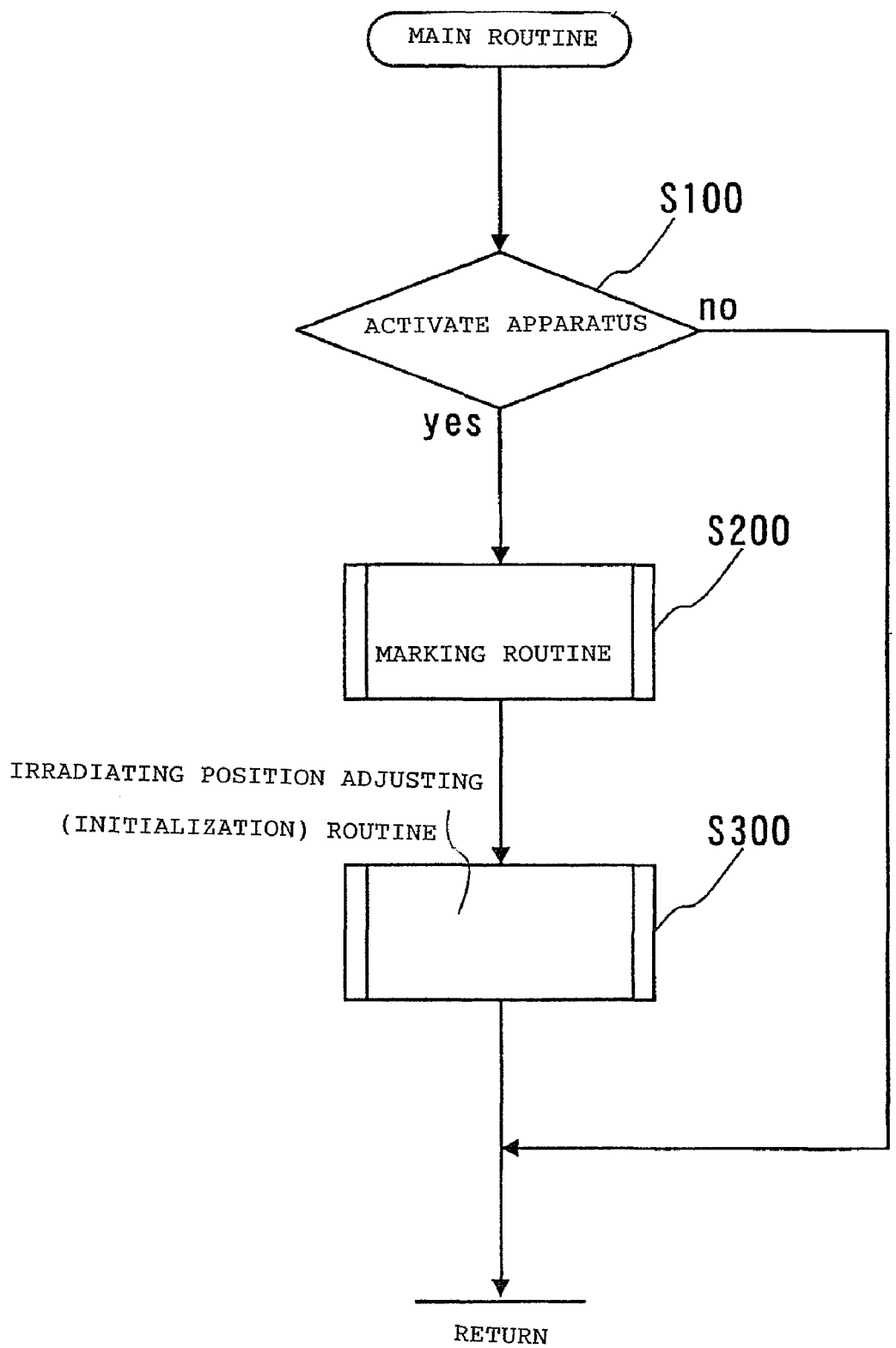
FIG. 12 illustrates a flowchart for an irradiating position adjusting routine according to the third embodiment of the invention.

Subsequently, an adjusting method of the deviation between the origin of the beam spot and the rotational center of the turntable in the third embodiment of the invention will be described along a flowchart shown in FIG. 12.

In the first and second embodiments of the invention, it is presumed that the mark for calculation of the rotational center of the turntable has previously been formed on the master disk D or the turntable. The third embodiment relates to an irradiating position adjusting method which is realized by presuming a case where no marks are formed on the master disk and the turntable. Prior to adjusting the irradiating position, a marking is performed to a scanning area by using the electron beam. Since the marking is performed by the electron beam, it is necessary that the marking area is made of a material which can be marked by the electron beam.

First, after the master disk D was put onto the turntable, by activating the master disk exposing apparatus, a marking routine is started (step S100).

Figure 13:
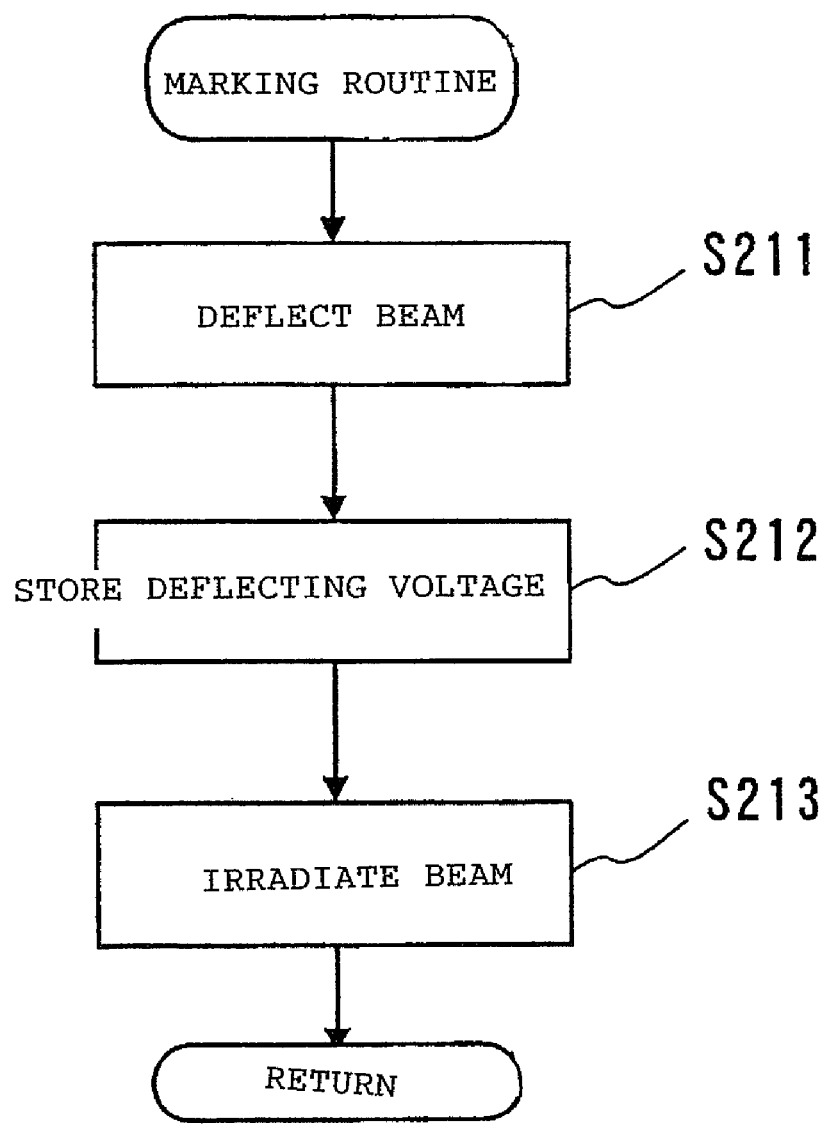
FIG. 13 illustrates a detailed flowchart for a marking routine according to the third embodiment of the invention.

A detailed flowchart of the marking routine (step S200) is shown in FIG. 13.

First, the signals, that is, the applied voltages are sent from the irradiating position adjusting circuit 430 to the beam deflector 206 and the apparatus enters a state where the electron beam can be deflected (step S211). The signals which are sent to the beam deflector 206 may be transmitted only to either the x-deflecting coil or the y-deflecting coil or can be also transmitted to both of the x-deflecting coil or the y-deflecting coil. It is, however, necessary that the applied voltages which are sent to the x-deflecting coil and the y-deflecting coil are set to a level within a range from $x_L$ to $x_H$ volts and a level within a range from $y_L$ to $y_H$ volts so that the marking is performed into the area shown in FIG. 8, respectively. The signals sent to the x-deflecting coil and the y-deflecting coil of the beam deflector 206 are stored as $(x_1, y_1)$ into the memory (step S212). Subsequently, the electron beam is irradiated onto the master disk and the mark is formed onto the master disk (step S213).

After completion of the marking, the processing routine advances to the irradiating position adjusting step (step S300). After that, an irradiating position adjustment similar to the first or second embodiment can be made. In the third embodiment, however, since the deflection signal transmitted from the irradiating position adjusting circuit 430 to the beam deflector 206 has been stored as $(x_1, y_1)$ into the memory in step S212, the scanning step can be omitted every once from the first and second embodiments in the irradiating position adjusting step (step S300). That is, if an irradiating position adjusting routine similar to that in the first embodiment is executed, n=2 instead of n=1 in step S301 in FIG. 6. The number of scanning times, therefore, is equal to 2 instead of 3. If an irradiating position adjusting routine similar to that in the second embodiment is executed, n=2 instead of n=1 in step S311 in FIG. 9. The number of scanning times, therefore, is equal to 1 instead of 2.

As mentioned above, according to the third embodiment of the invention, even if the mark is not preliminarily formed on the master disk or the turntable, the irradiating position adjustment can be made, so that a troublesomeness to previously form the mark can be omitted. Since the number of scanning times can be omitted by one time as compared with the cases of the first and second embodiments, the deviation can be easily and promptly adjusted.

Subsequently, a method of manufacturing a magnetic recording medium such as a hard disk as an example of patterned media by using the master disk exposing apparatus of the embodiment of the invention will be described with reference to FIGS. 14, 15, and 16.

What is called a hard disk is a magnetic recording medium in which magnetic particles have artificially and regularly arranged and the recording of one bit can be logically executed per magnetic particle. For example, in the case of a pattern of a bit interval of about 25 nm, therefore, a very high recording density of about 1 Tbpsi (T bits/inch$^2$) can be realized.

Figure 14:
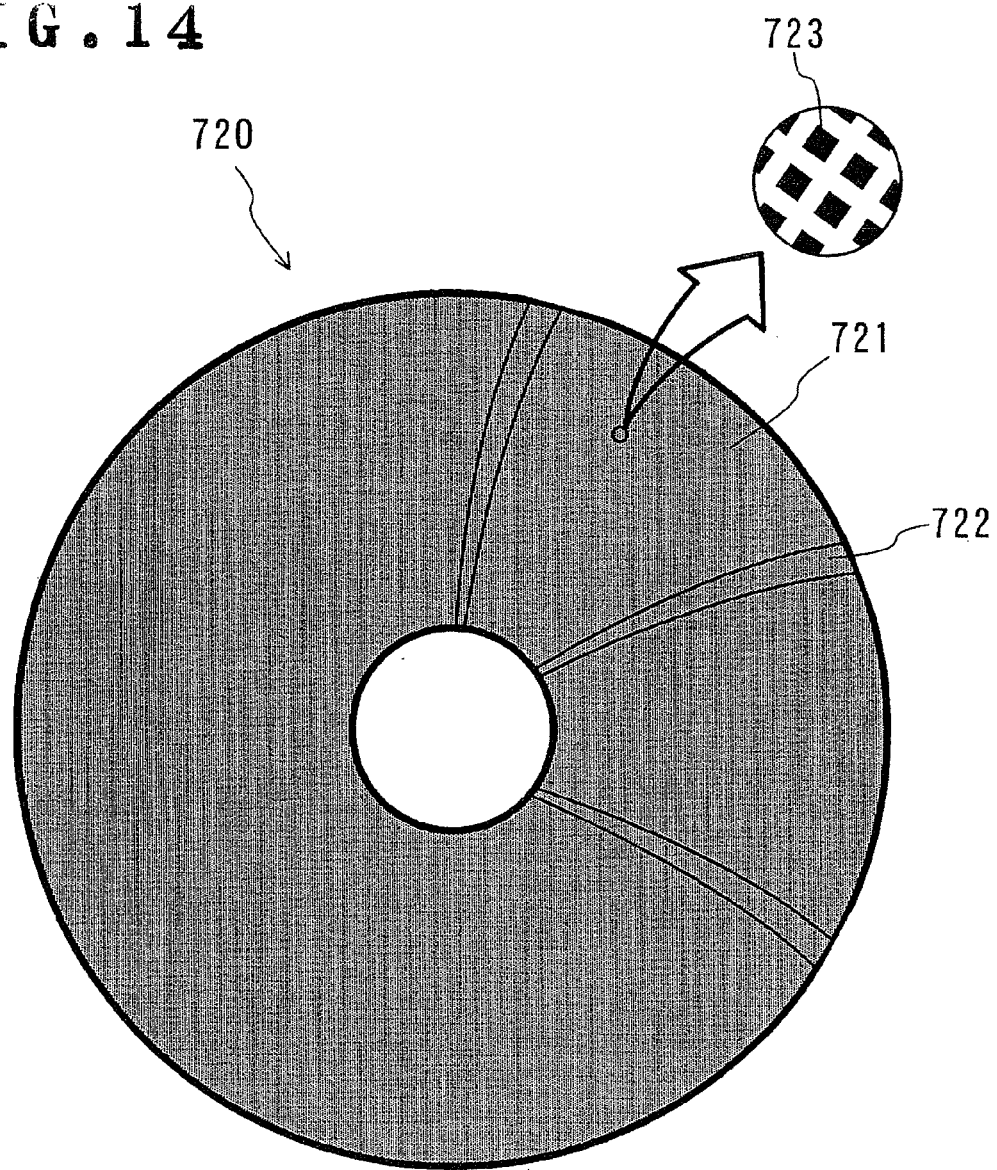
FIG. 14 illustrates a schematic plan view of a hard disk.

An example of a pattern shape which is formed on the hard disk is shown in FIG. 14. As shown in FIG. 14, the pattern shape which is formed on a hard disk 720 is generally constructed by a data track portion 721 and a servo pattern portion 722. A recording pattern of a dot train 723. is concentrically arranged in the data track portion 721. A square pattern showing address information and track detection information, a line-shaped pattern extending in such a direction as to transverse a track for extracting clock timing, and the like have been formed in the servo pattern portion 722.

As a method of realizing the pattern of the bit interval of a nano level as mentioned above, a nano-imprinting process has been proposed. According to the nano-imprinting process, while pressing a mold (transfer type) to a fused-like resin coated on a substrate, the resin is hardened, thereby transferring the concave/convex shape of tens to hundreds of nm formed on one surface of the mold onto the resin. The nano-imprinting process is mainly classified into a thermal type nano-imprint and a light-hardening type nano-imprint depending on a hardening method of the resin (refer to Japanese Patent Application Laid-open Kokai No. 2004-148494 and S. Y. Chou et al., Appl. Phys. Lett. 67, 3314 (1995)).

Figure 15:
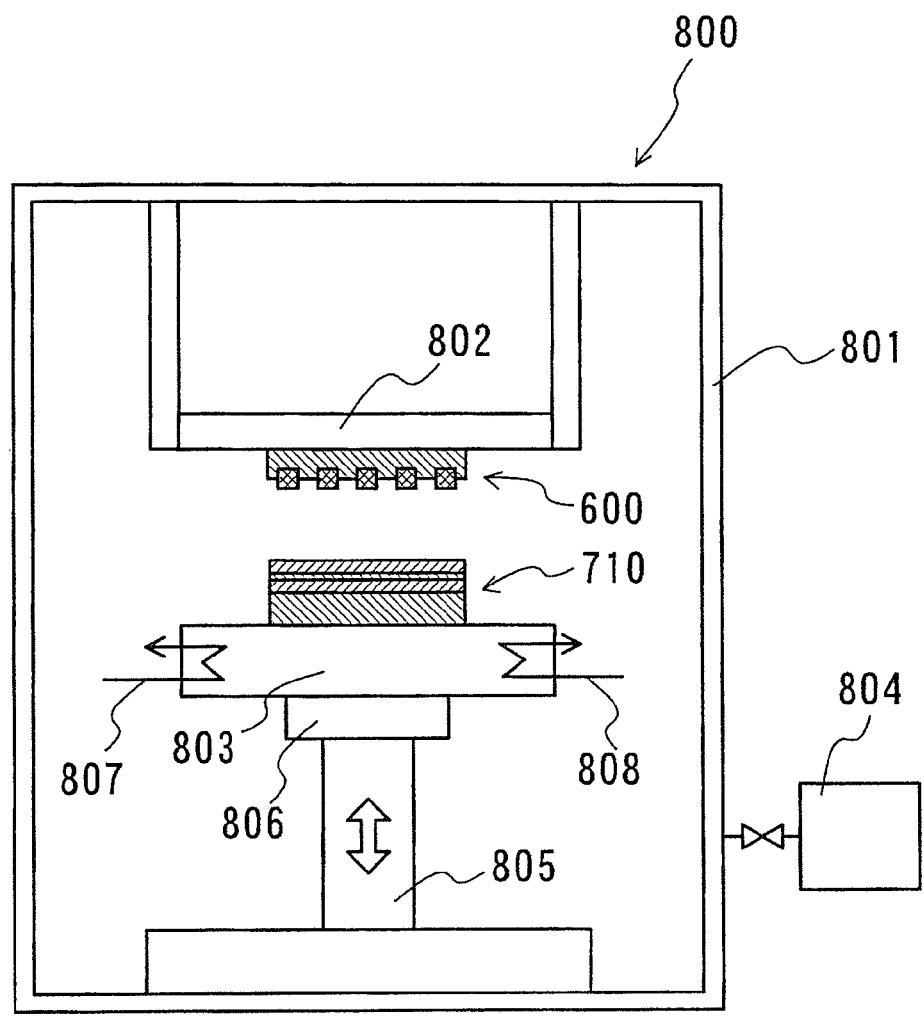
FIG. 15 illustrates a schematic diagram of a nano-imprinting apparatus.
Figure 16:
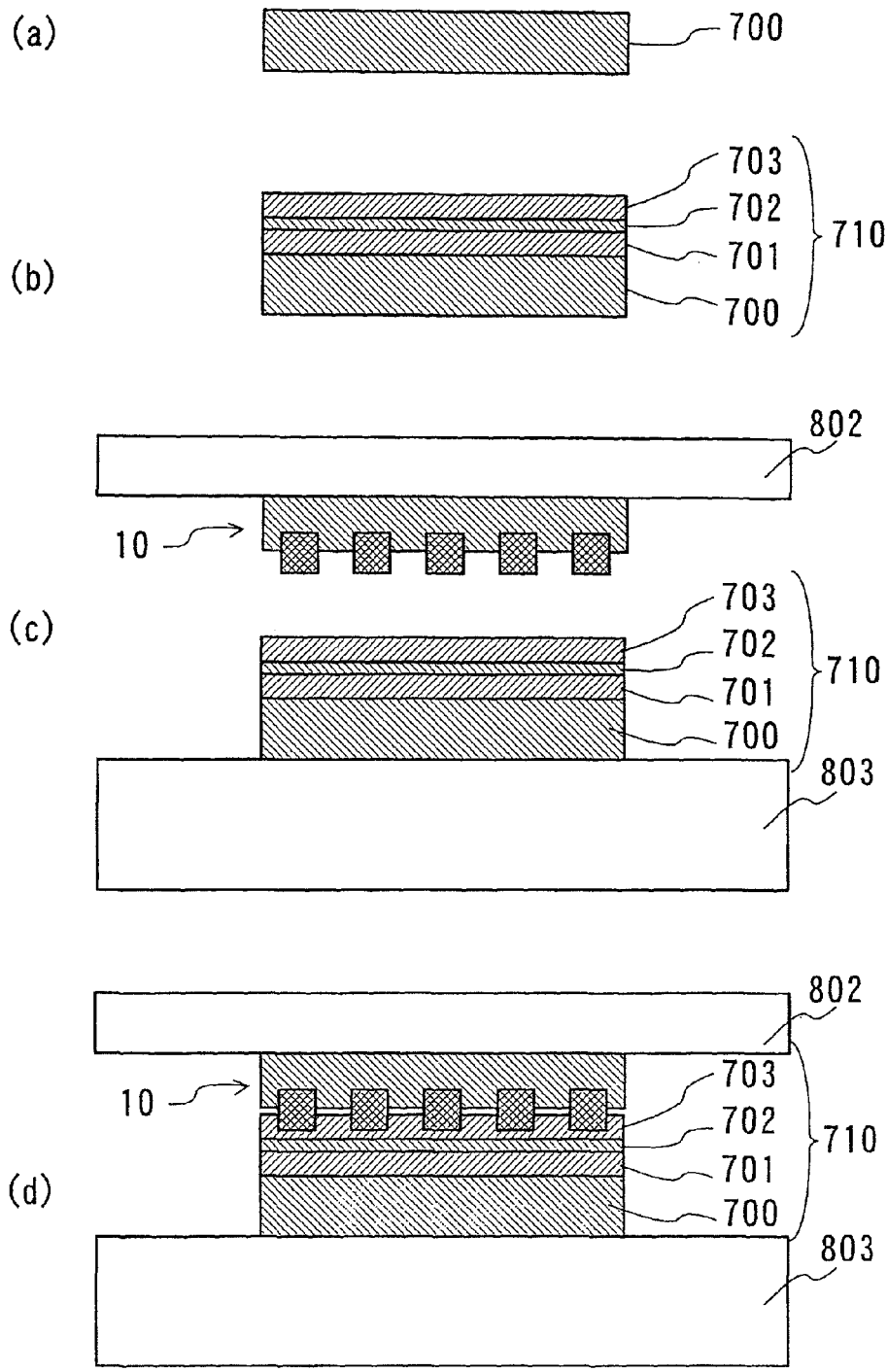
FIG. 16 illustrates a diagram for describing steps of manufacturing the hard disk by using a mold formed by using the master disk exposing apparatus of the invention.
Figure 16:
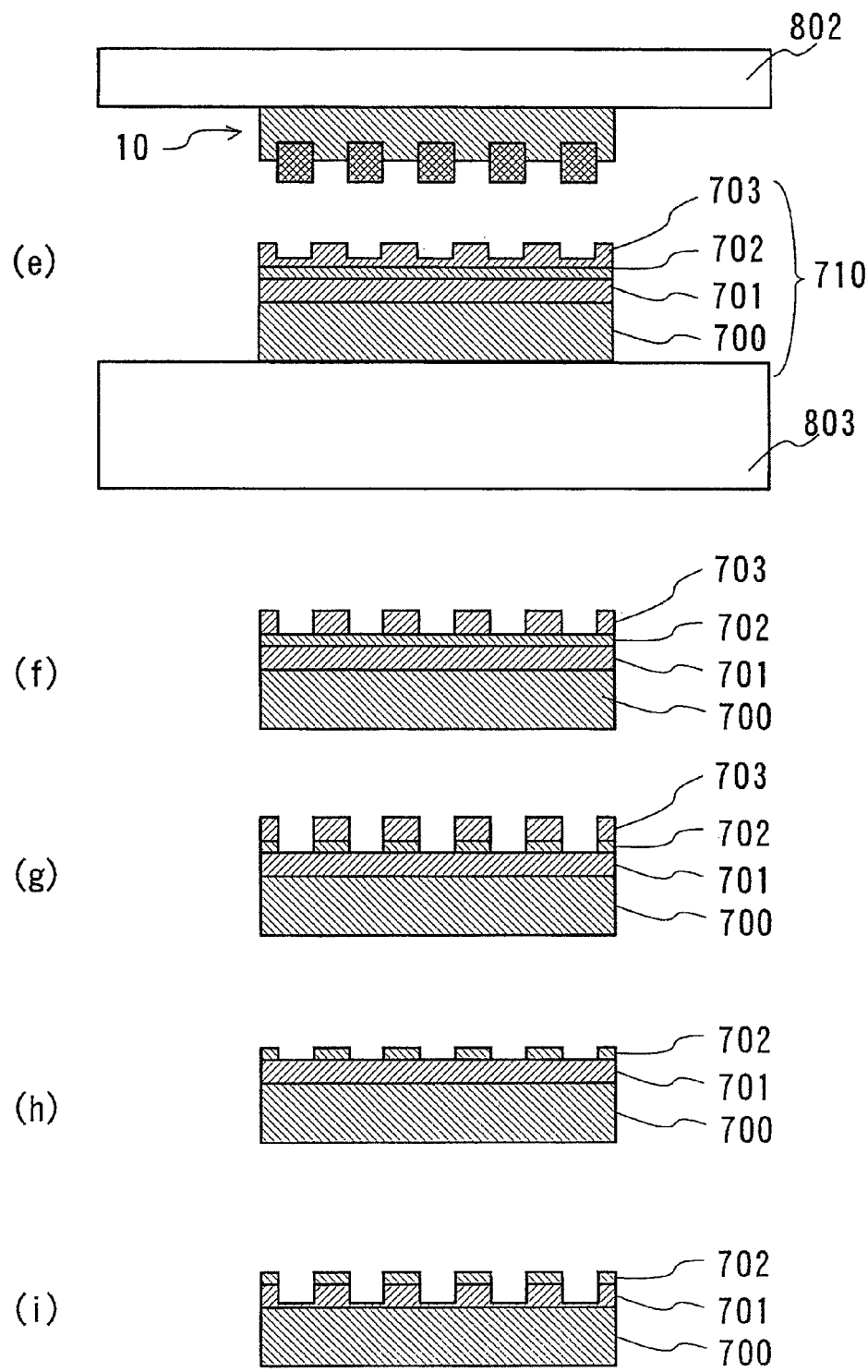
Figure 16:
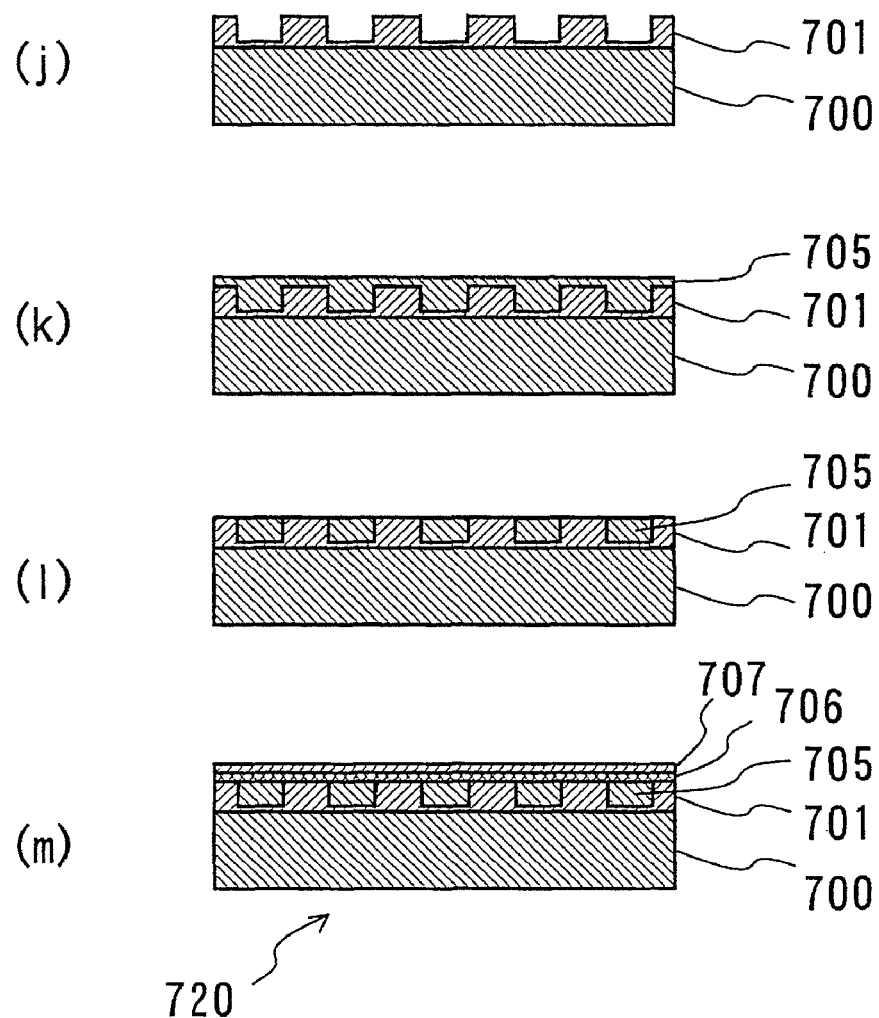

In the case of the thermal type nano-imprint, generally, a thermal nano-imprinting apparatus as shown in FIG. 15 is used. That is, a thermal nano-imprinting apparatus 800 is provided in a chamber 801 to which a vacuum pump 804 has been connected in order to remove a solvent or the like which is caused from a resist upon imprinting. A mold supporting portion 802 for supporting a mold 600 is fixed in an upper portion of the chamber 801. A stage 803 for supporting an object 710 to be transferred is attached so as to face the mold supporting portion 802. The stage 803 is mounted to an elevating apparatus 805 which is driven by an oil pressure or the like, so that the object 710 to be transferred is lifted up and pressed to the mold 600 and the transfer is performed. A load cell 806 is disposed between the stage 803 and the elevating apparatus 805 and a pressing force upon transfer is measured.

A heater 807 and a cooler 808 for heating/cooling the object 710 to be transferred are provided for the stage 803.

Since the concave/convex pattern of about 10 nm can be transferred by using the nano-imprint as mentioned above, the hard disk as mentioned above can be easily manufactured. Since it is necessary to pattern the high-fine concave/convex shape of tens to hundreds of nm onto the mold as mentioned above, it is desirable to use the master disk exposing apparatus of the invention which can form the high-fine pattern at high precision.

An example of steps of forming the mold by using the master disk exposing apparatus of the invention will be described hereinbelow. First, a base portion made of a heat resistant material such as Si to which microfabrication can be performed is coated with the resist for electron beam exposure by a spin coater or the like. Subsequently, the electron beam is irradiated toward the resist by using the master disk exposing apparatus of the invention, thereby directly drawing the pattern. After that, a mask pattern is formed onto the resist by developing the resist. A dry etching is performed by using the resist formed with the mask pattern as a mask, thereby forming the pattern in the base portion. After that, the etching mask is removed by ashing or the like and the mold is completed.

Subsequently, steps of manufacturing the hard disk shown in FIG. 14 by using the foregoing mold will be described with reference to FIGS. 16(a) to 16(m).

First, as shown in FIG. 16(a), a base substrate 700 (for the recording medium) which is made of a material such as special-processed chemically reinforced glass, an Si wafer, or an aluminum plate is prepared.

A recording film layer 701 is formed onto the base substrate 700 by sputtering or the like. In the case of a perpendicular magnetic recording medium, the recording film layer has a laminate structure constructed by a soft magnetic underlayer, an intermediate layer, and a ferromagnetic recording layer. Subsequently, a metal mask layer 702 made of a metal such as Ta or Ti is formed onto the recording film layer 701 by sputtering or the like. Finally, a material 703 to be transferred is formed as a film onto the metal mask layer 702 by spin coating or the like, thereby forming the object 710 to be transferred. A thermoplastic resin such as a polymethyl methacrylate resin (PMMA) is used for the hard disk. The object 710 to be transferred formed as mentioned above is illustrated in FIG. 16(b). A light-hardening resin may be used for the material 703 to be transferred. In this instance, a light-hardening type nano-imprinting apparatus is used as a nano-imprinting apparatus.

Subsequently, as illustrated in FIG. 16(c), the mold 600 formed by using the foregoing object 710 to be transferred and the master disk exposing apparatus of the invention is set into the thermal nano-imprinting apparatus in such a manner that the material 703 to be transferred and the concave/convex surface of the mold 600 face each other, and the nano-imprinting apparatus 800 is activated. As illustrated in FIG. 16(d), therefore, the stage 803 rises and the imprint is executed according to a predetermined sequence. After the imprint was executed, as shown in FIG. 16(e), the stage 803 falls and the transfer is completed.

Subsequently, the transferred object 710 is extracted from the nano-imprinting apparatus 800 and a residual film portion of the material 703 to be transferred is removed as shown in FIG. 16(f) by ashing or the like using an $O_2$ gas or the like. The pattern of the remaining material 703 becomes the etching mask for etching the metal mask layer 702.

Subsequently, as shown in FIG. 16(g), the material 703 to be transferred is used as an etching mask and the metal mask layer 702 is etching-processed by using a $CHF_3$ gas or the like. After that, as shown in FIG. 16(h), the material 703 to be transferred is removed by dry ashing using either a wet process or dry ashing using the $O_2$ gas or the like.

Subsequently, as shown in FIG. 16(i), the metal mask layer 702 is used as an etching mask and the recording film layer 701 is etching-processed by dry etching by using an Ar gas or the like. After that, as shown in FIG. 16(j), the metal mask layer 702 is removed by the wet process or dry etching.

Subsequently, as shown in FIG. 16(k), groove portions of the pattern formed on the surface of the recording film layer 701 by the sputtering, coating step, or the like are filled with a nonmagnetic material 705 (in the case of the magnetic recording medium, nonmagnetic material such as $SiO_2$).

Subsequently, as shown in FIG. 16(l), the surface is ground and polished by an etch back, chemical polish, or the like and flattened. A structure in which the recording material has been separated by the non-recording material, consequently, is formed.

Finally, as shown in FIG. 16(m), for example, by forming a protecting film 706 or a lubricating film 707 of the recording film layer onto the surface by a coating method or a dipping method, the hard disk 720 is completed.

As described in detail above, by forming the mother disk by using the master disk exposing apparatus according to the invention, the patterned media having the high-fine pattern structure can be manufactured. Although the embodiments have been described with respect to the patterned media as an example, the invention is not limited to it but can be also applied to, for example, discrete track media.

The invention claimed is:

1. A master disk exposing apparatus comprising: a turntable for rotating a master disk; a moving portion for horizontally moving said turntable in at least one direction; a beam irradiating portion for irradiating an electron beam toward said turntable, thereby forming a beam spot onto said turntable or said master disk; a beam deflecting portion for deflecting said beam; and control portion for controlling said moving portion, said beam irradiating portion, and said beam deflecting portion, wherein said control portion includes initializing means for executing an initial operation to drive at least either said moving portion or said beam deflecting portion and make an origin of said beam spot coincide with a rotational center of said turntable at the time of activation.

2. A master disk exposing apparatus according to claim 1, wherein said initial operation to make the origin of said beam spot coincide with the rotational center of said turntable is executed by detecting a position of a mark formed on said turntable or the surface of said master disk.

3. A master disk exposing apparatus according to claim 2, wherein said initializing portion comprises:
a mark position detecting portion for obtaining a mark position signal indicative of said mark position on the basis of a secondary electron or a reflection electron which is obtained from said beam spot;
a rotational center deviation amount detecting portion for detecting a deviation amount of a position of the rotational center of said turntable from an origin of the beam on the basis of at least two of said mark signals which are obtained at different angle positions on said turntable or said master disk; and
a first beam position adjusting portion for driving said beam deflecting portion on the basis of said deviation amount so that said rotational center coincides with said beam origin.

4. A master disk exposing apparatus according to claim 2, wherein said initializing portion comprises:
a mark position detecting portion for obtaining a mark position signal indicative of said mark position on the basis of a secondary electron or a reflection electron which is obtained from said beam spot;
a rotational center deviation amount detecting portion for detecting a deviation amount of a position of the rotational center of said turntable from the origin of the beam on the basis of at least two of said mark signals which are obtained at different angle positions on said turntable or said master disk; and
a second beam position adjusting portion for driving said moving portion on the basis of said deviation amount so that said rotational center coincides with said beam origin.

5. A master disk exposing apparatus according to claim 1, wherein said master disk exposing apparatus forms a mark into an area on said master disk and excluding its rotational center by using said beam before said initial operation.

6. An adjusting method of a beam irradiating position of a master disk exposing apparatus comprising: a turntable for rotating a master disk; a moving portion for horizontally moving said turntable in at least one direction; a beam irradiating portion for irradiating an electron beam toward said turntable, thereby forming a beam spot onto said turntable or said master disk; a beam deflecting portion for deflecting said beam; and a control portion for controlling said moving portion, said beam irradiating portion, and said beam deflecting portion, comprises a step of:
performing an initial operation to drive at least either said moving portion or said beam deflecting portion and make an origin of said beam spot coincide with a rotational center of said turntable is executed at the time of activation.

7. An adjusting method of the beam irradiating position according to claim 6, further comprising:
a mark position detecting step of obtaining a mark position signal which is obtained on the basis of a secondary electron or a reflection electron that is obtained from said beam spot and which indicates a position of a mark formed on said turntable or a surface of said master disk;
a rotational center deviation amount detecting step of detecting a deviation amount of a position of a rotational center of said turntable from the origin of the beam on the basis of at least two of said mark signals which are obtained at different angle positions on said turntable or said master disk; and
a beam position adjusting step of driving said beam deflecting portion on the basis of said deviation amount so that said rotational center coincides with said beam origin.

8. An adjusting method of the beam irradiating position according to claim 7, wherein:
in said mark position detecting step, said turntable is rotated by a first predetermined angle, a second predetermined angle, and a third predetermined angle, and first, second, and third mark position signals are detected, respectively, and
in said rotational center deviation amount detecting step, the deviation amount of the position of the rotational center of said turntable from the beam origin is detected on the basis of said first, second, and third mark position signals.

* * * * *